(12) United States Patent  
Sano

(10) Patent No.: US 7,692,702 B2  
(45) Date of Patent: Apr. 6, 2010

(54) SOLID-STATE IMAGING DEVICE WITH AMPLIFIERS CORRESPONDING TO SIGNAL LINES AND ALTERNATING CONTROL VOLTAGE

(75) Inventor: Takafumi Sano, Suwa (JP)

(73) Assignee: Seiko Epson Corporation (JP)

( * ) Notice: Subject to any disclaimer, the term of this patent is extended or adjusted under 35 U.S.C. 154(b) by 906 days.

(21) Appl. No.: 11/425,756

(22) Filed: Jun. 22, 2006

(65) Prior Publication Data

US 2007/0001098 A1 Jan. 4, 2007

(30) Foreign Application Priority Data

Jul. 1, 2005 (JP) ............... 2005-193444

(51) Int. Cl.  
*H04N 3/14* (2006.01)

(52) U.S. Cl. .................. 348/300; 348/294; 348/301

(58) Field of Classification Search .......... 348/300, 348/294, 301  
See application file for complete search history.

(56) References Cited

U.S. PATENT DOCUMENTS

| | | | | |
|---|---|---|---|---|
| 5,633,594 A | * | 5/1997 | Okada | 324/679 |
| 5,751,154 A | * | 5/1998 | Tsugai | 324/661 |
| 5,825,056 A | * | 10/1998 | Yonemoto | 257/290 |
| 6,040,569 A | * | 3/2000 | Hynecek | 250/208.1 |
| 6,278,754 B1 | * | 8/2001 | Thomas et al. | 375/360 |
| 6,462,979 B2 | * | 10/2002 | Schlosser et al. | 365/158 |
| 6,529,015 B2 | * | 3/2003 | Nonoyama et al. | 324/678 |
| 6,797,932 B2 | * | 9/2004 | Takahashi et al. | 250/208.1 |
| 6,864,919 B2 | | 3/2005 | Hua | |
| 6,873,362 B1 | * | 3/2005 | Yonemoto | 348/302 |
| 7,071,709 B2 | * | 7/2006 | Itakura et al. | 324/662 |
| 2003/0025816 A1 | * | 2/2003 | Sakuragi | 348/301 |

FOREIGN PATENT DOCUMENTS

| | | |
|---|---|---|
| JP | 10-136266 | 5/1998 |
| JP | 2965777 | 8/1999 |
| JP | 2000-188724 | 7/2000 |
| JP | 2002-232786 | 8/2002 |
| JP | 2004-241491 | 8/2004 |

* cited by examiner

*Primary Examiner*—Jason Chan  
*Assistant Examiner*—Usman Khan  
(74) *Attorney, Agent, or Firm*—Harness, Dickey & Pierce, P.L.C.

(57) ABSTRACT

A solid-state imaging device includes a substrate, a sensor cell array disposed on the substrate, the sensor cell array having a plurality of sensor cells arranged in a matrix, a plurality of signal lines for transferring an image signal output from each of the sensor cells, a plurality of amplifiers connected to at least one of the signal lines, each of the amplifiers including a first capacitance having a first end connected to one of the signal lines, an inversion amplifier having an input end connected to a second end of the first capacitance, a second capacitance connected between the input end and an output end of the inversion amplifier, a switch connected between the input and output ends of the inversion amplifier to reset the second capacitance and a third capacitance having a first end connected to a control line and a second end connected to the input end of the inversion amplifier, and a control voltage supply circuit for supplying one of first and second voltages to the control line.

14 Claims, 6 Drawing Sheets

SOLID-STATE IMAGING DEVICE WITH AMPLIFIERS CORRESPONDING TO SIGNAL LINES AND ALTERNATING CONTROL VOLTAGE

The entire disclosure of Japanese Patent Application No. 2005-193444 is expressly incorporated by reference herein.

BACKGROUND OF THE INVENTION

1. Technical Field

The present invention relates to a solid-state imaging device suitable for use in an apparatus using both rolling and frame shutter modes.

2. Related Art

A CCD (charge-coupled device) type image sensor (hereinafter referred to as a "CCD sensor") and a CMOS type image sensor (hereinafter referred to as a "CMOS sensor") are used as solid-state imaging devices incorporated in cellular phones, digital cameras and the like. In addition, a MOS type solid-state imaging device (hereinafter referred to as a "substrate modulation sensor") has been proposed that uses a threshold-voltage modulation system combining high image quality with low power consumption. CMOS sensors and substrate modulation sensors (hereinafter collectively referred to as "CMOS sensors and the like") are recently being developed because of their benefits of lower power consumption and process cost compared to CCD sensors.

Some of the CMOS sensors and the like employ a rolling shutter mode in which image signals are read out line by line, while others of them employ a frame shutter mode in which light-generated charges are stored simultaneously in many light receiving elements that are arranged two-dimensionally.

Meanwhile, in the CMOS sensors and the like, in order to remove noise components, correlated double sampling (CDS) is performed. In this method, both a pixel output after light reception by a photodiode and a pixel output after pixel-charge clearance (reset) are sampled to obtain a difference between the outputs.

By way of example using a type of CMOS-APS (Active Pixel Sensor) having four transistors, a brief explanation will be provided as below, regarding the double sampling process of a CMOS sensor in the rolling shutter mode. First, in order to read out a noise component, a floating diffusion, which is a charge accumulation region, is reset. Next, a potential based on a light-generated charge remaining in the floating diffusion region is output (readout of a noise component). After this, a light-generated charge generated by a photodiode is transferred to the floating diffusion region. Then, a potential based on the light-generated charge transferred thereto is output (readout of a signal component). The noise component is removed by processing a difference between the readout noise and signal components.

In the CMOS sensors and the like as shown above, an image signal-readout operation is performed line by line, and so is noise readout. That is, pixel reset (clearance) is also done line by line. In the rolling shutter mode, transfer of a light-generated charge generated by a photodiode to a floating diffusion is also performed line by line. Accordingly, as described above, noise components can be read out before the readout of signal components.

On the other hand, in the frame shutter mode, light-generated charges of all pixels are transferred collectively to the floating diffusion region. Accordingly, noise components cannot be read out before the readout of signal components. In other words, it is necessary for CMOS sensors and the like employing the frame shutter mode to repeat a line-by-line operation including a signal readout of a line, a pixel reset of a readout line and a noise readout of the line after transferring the light-generated charges of all the pixels to the floating diffusion region.

As mentioned above, in the CMOS sensors and the like, depending on which of the shutter modes is employed, the readout order between a noise component and a signal is reversed.

Japanese Patent No. 2965777 is an example of related art.

The difference between a noise component and a signal component can be detected by a circuit disposed at each readout signal line. In the example of related art, a noise component is removed by an FPN (fixed pattern noise) suppression circuit disposed at a vertical signal line VL.

An FPN suppression circuit, which is composed of a plurality of capacitive elements and an inversion amplifier, detects a difference between the noise component and a signal component to output a signal after a noise removal. The FPN suppression circuit uses an inversion amplifier. Thus, based on a threshold of the inversion amplifier, the circuit outputs a signal whose output level increases in a direction opposite to a changing direction of an input signal.

For example, if the output level of a component Vo based on a noise readout is higher than that of a component Vps based on a signal readout, in the rolling shutter mode giving precedence to a noise readout, the level of a signal input to the FPN suppression circuit drops from a high to lower value. Consequently, the level of a signal output from the FPN suppression circuit increases in accordance with the reduced level of the input signal On the contrary, the frame shutter mode prioritizes readout of a signal component. Thus, the level of a signal input to the FPN suppression circuit increases from a low to higher value. As a result, the level of a signal output from the FPN suppression circuit drops to a lower value in accordance with the increased level of the input signal.

That is, based on the threshold of the inversion amplifier, in the rolling shutter mode, the output voltage of the FPN suppression circuit increases in the positive side, whereas in the frame shutter mode, the output voltage thereof increases in the negative side.

Therefore, in the case of the CMOS sensors and the like using both rolling and frame shutter modes, the output level of an FPN suppression circuit is likely to deviate from a dynamic range of the circuit.

In the FPN suppression circuit used in the above example of related art, the dynamic range thereof can be set so as to be corresponding to each shutter mode by switching a threshold voltage applied to the inversion amplifier. In this case, however, a plurality of threshold voltages needs to be prepared to switch, resulting in an increase in the circuit size.

SUMMARY

An advantage of the present invention is to provide a solid-state imaging device capable of preventing an output voltage in each of the rolling and frame shutter modes from deviating from a dynamic range thereof even when using a single threshold voltage A solid-state imaging device according to one aspect of the invention includes a substrate, a sensor cell array disposed on the substrate, the sensor cell array having a plurality of sensor cells arranged in a matrix, a plurality of signal lines for transferring an image signal output from each of the sensor cells, a plurality of amplifiers connected to at least one of the signal lines, each of the amplifiers including a first capacitance having a first end connected to one of the signal lines, an inversion amplifier having an input end connected to a second end of the first capacitance, a second capacitance connected between the input end and an output end of the inversion amplifier, a switch connected between the input and output ends of the inversion amplifier to reset the second capacitance and a third capacitance having a first end connected to a control line and a second end connected to the input end of the inversion amplifier, and a control voltage supply circuit for supplying one of first and second voltages to the control line.

According to the embodiment above, based on an image signal sent from each sensor cell, electric charge is maintained in the first and second capacitances. The switch is connected between the input and output ends of the inversion amplifier and resets the second capacitance. A voltage at the input end of the inversion amplifier is close to a threshold voltage of the inversion amplifier. When first and second image signals are input from each sensor cell, the second capacitance maintains a voltage based on a difference between the first and second image signals. One of the first and second voltages is supplied to the third capacitance, whereby a voltage component having a polarity opposite to that of the voltage based on the difference therebetween is maintained in the second capacitance. In other words, the voltage maintained in the second capacitance is equivalent to the voltage based on the difference between the first and second pixel signals, but the polarity thereof is shifted oppositely from that of the voltage based on the difference therebetween. This can prevent the output of the amplifier from deviating from a dynamic range thereof.

Additionally, it is preferable that each of the amplifiers is disposed for each of the signal lines, whereas the control voltage supply circuit is disposed as a single unit for supplying a control voltage to all of the amplifiers.

According to the embodiment above, the use of the single control voltage supply circuit for all of the amplifiers can prevent an increase in the circuit area.

In addition, preferably, each of the sensor cells outputs first and second pixel signals of different levels.

In addition, preferably, each of the sensor cells has a charge accumulation region for transferring a light-generated charge based on an incident light to output a pixel signal based on the light-generated charge accumulated in the region, and outputs a pixel signal after a reset of the light-generated charge in the region and a pixel signal based on the light-generated charge accumulated in the region.

According to the embodiment above, each sensor cell outputs the pixel signal after the reset of the light-generated charge in the charge accumulation region, namely, a noise component, as well as the pixel signal based on the amount of light. The amplifiers can output a pixel signal in which a difference between those pixel signals, namely the noise component has been removed.

Preferably, the sensor cells are CMOS sensors or substrate modulation sensors.

According to the embodiment above, in the CMOS sensor or the substrate modulation sensor, the amplifier can output a pixel signal obtained by removing a noise component from a pixel signal in each of the rolling and frame shutter modes. In this case, in either mode, the amplifier can output a pixel signal that does not deviate from a dynamic range thereof.

In addition, preferably, the control voltage supply circuit supplies 0V as the first voltage and a power supply voltage as the second voltage.

According to the embodiment above, a voltage component based on the power supply voltage and a capacitance value of the third capacitance is added to the second capacitance.

Furthermore, preferably, the control voltage supply circuit is made up of an inverter.

According to the embodiment above, with a simple structure, the control voltage supply circuit can selectively apply 0V or the power supply voltage to a control input end.

In addition, preferably, the control voltage supply circuit switches one of the first and second voltages in response to a reset of the second capacitance.

According to the embodiment above, the voltage component based on the power supply voltage and the capacitance value of the third capacitance can be added to the second capacitance.

Furthermore, preferably, the inversion amplifier is made up of an operational amplifier.

According to the embodiment above, the voltage at the input end of the inversion amplifier can be made closer to a threshold voltage of the inversion amplifier to maintain the voltage based on the difference between the first and second image signals in the second capacitance.

Furthermore, the inversion amplifier may be made up of a source-grounded transistor.

According to the embodiment above, the inversion amplifier can be composed of a simple circuit.

Furthermore, preferably, each sensor cell outputs first and second pixel signals of different levels, and the control voltage supply circuit supplies only one of the first and second voltages when the second pixel signal is input at a high level after the first pixel signal has been input at a low level.

According to the embodiment above, in one of the rolling and frame shutter modes, it is only necessary to perform a shifting control of a dynamic range using the third capacitance.

In addition, preferably, the inversion amplifier is made up of an inverter.

According to the embodiment above, the inversion amplifier can be composed of a simple circuit.

In addition, preferably, each sensor cell outputs first and second pixel signals of different levels, and the control voltage supply circuit supplies only one of the first and second voltages when the second pixel signal is input at a low level after the first pixel signal has been input at a high level.

According to the embodiment above, in one of the rolling and frame shutter modes, it is only necessary to perform a shifting control of a dynamic range using the third capacitance.

In addition, preferably, the third capacitance is made up of a capacitance of a periphery of a capacitance formation region including a formation region of the sensor cell array.

According to the embodiment above, an increase in a chip area can be prevented.

BRIEF DESCRIPTION OF THE DRAWINGS

The present invention will be described with reference to the accompanying drawings, wherein like numbers reference like elements.

DESCRIPTION OF EXEMPLARY EMBODIMENTS

Figure 1:
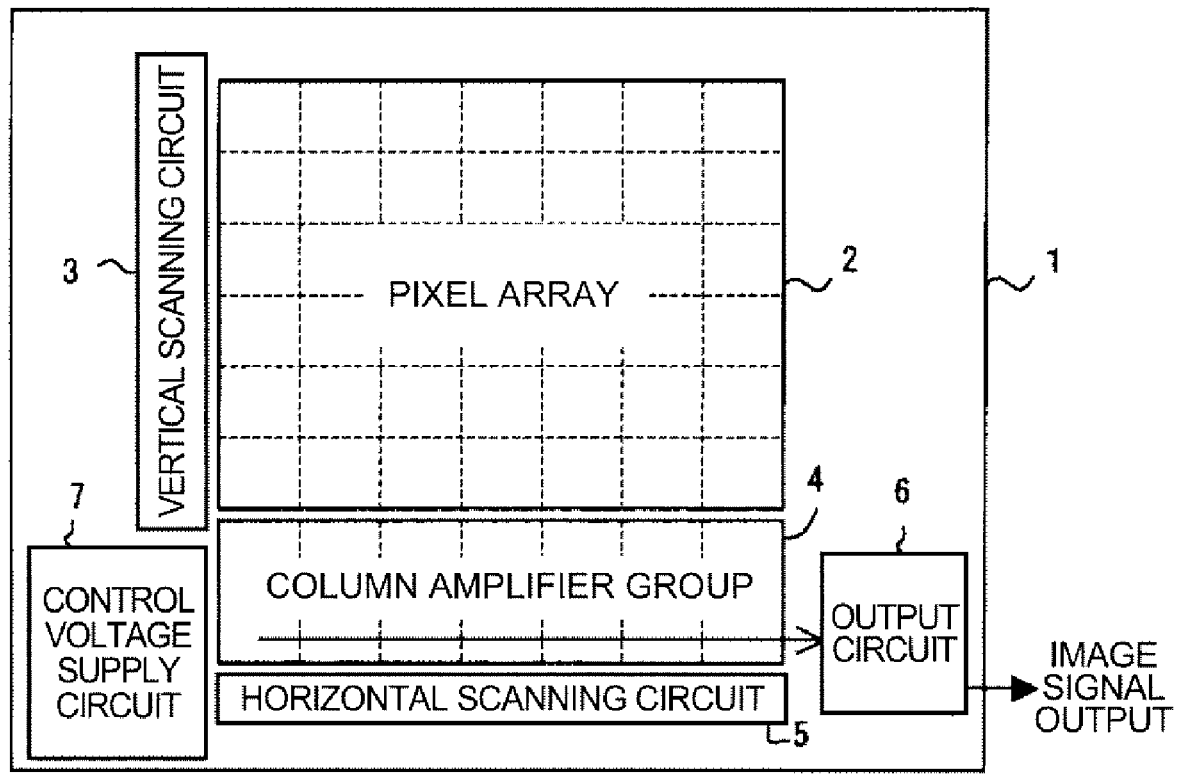
FIG. 1 is a block diagram showing a solid-state imaging device according to a first embodiment of the invention.
Figure 2:
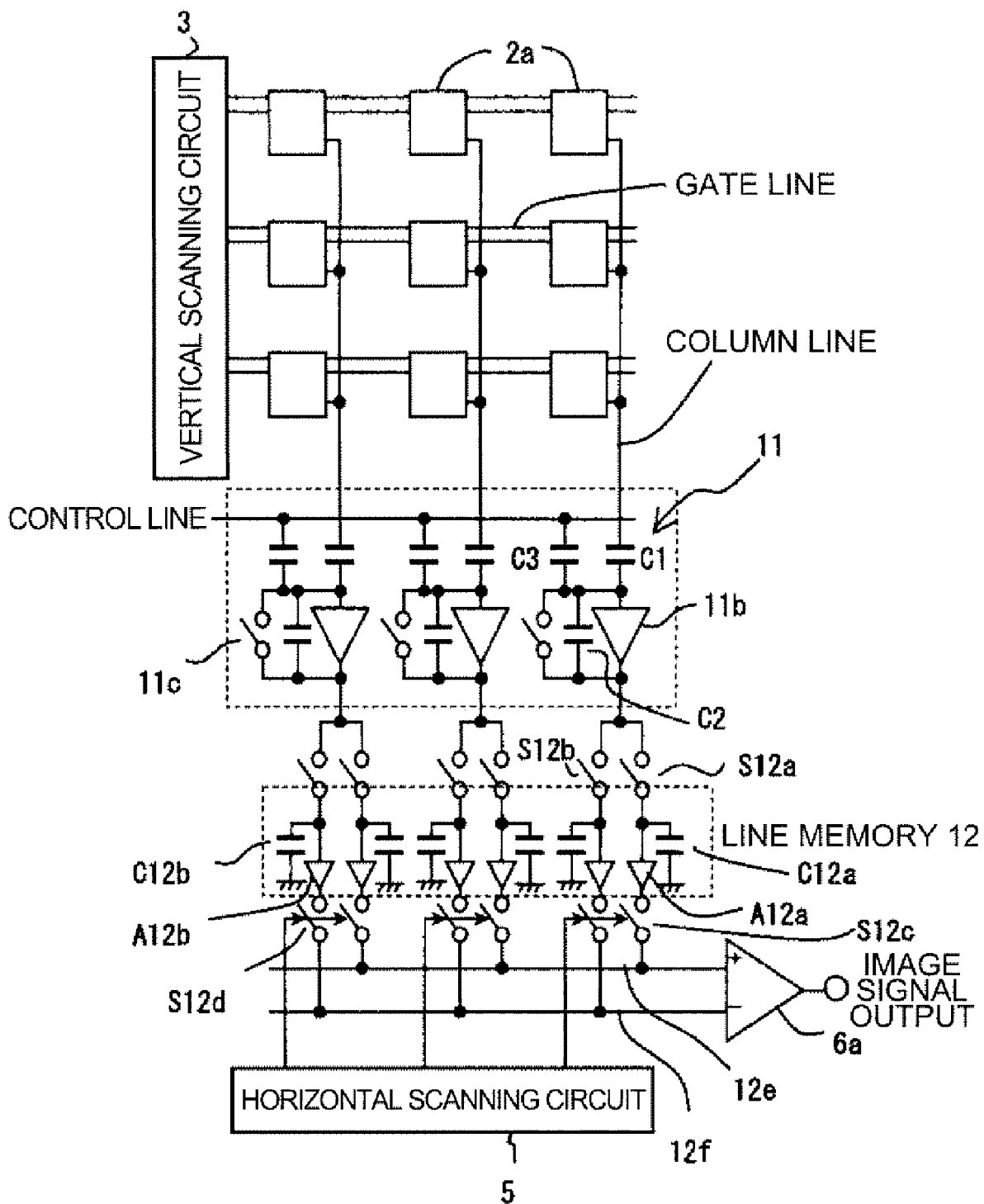
FIG. 2 is a circuit diagram showing the circuit structure of the imaging device shown in FIG. 1.
Figure 3:
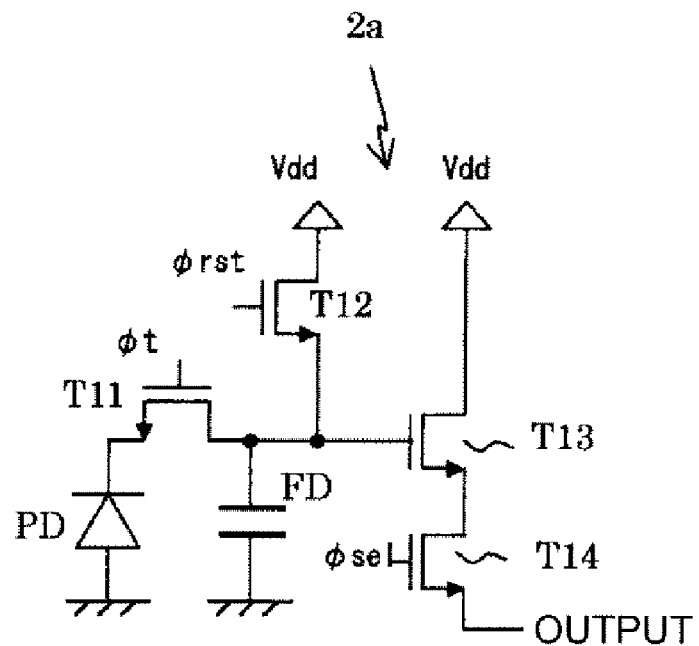
FIG. 3 is a circuit diagram showing one example of sensor cells making up a pixel array.
Figure 4A:
FIGS. 4A and 4B are waveform diagrams, respectively showing an output of the sensor cell shown in FIG. 3.
Figure 4B:
Figure 5:
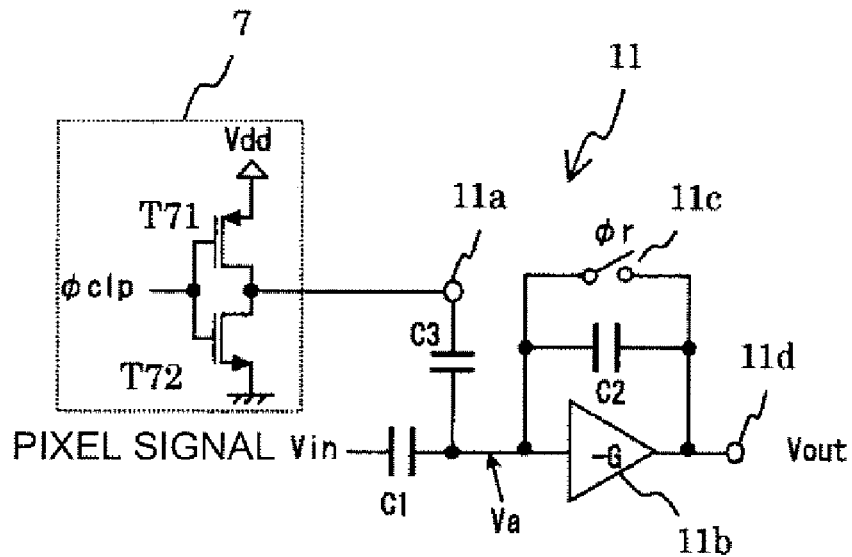
FIG. 5 is a circuit diagram showing detailed structures of a single column amplifier of a column amplifier group and a control voltage supply circuit.
Figure 6:
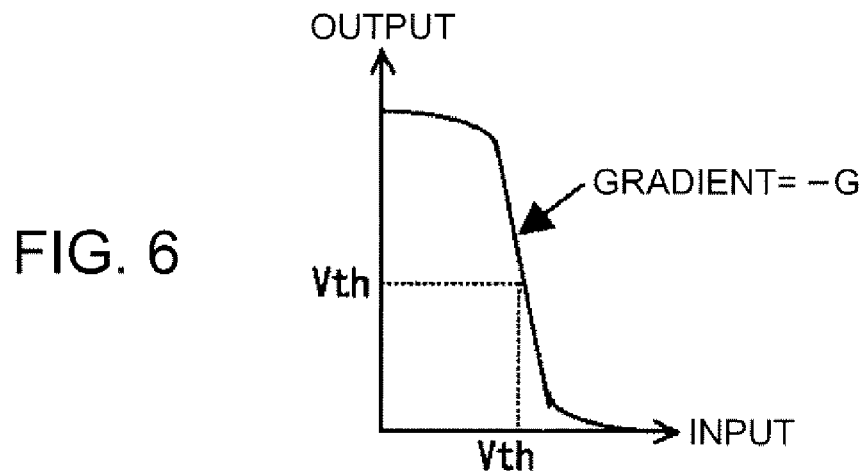
FIG. 6 is a graph showing characteristics of an inversion amplifier included in the column amplifier.

Embodiments of the invention will be described to the accompanying drawings. FIG. 1 is a block diagram showing a solid-state imaging device according to a first embodiment of the present invention. FIG. 2 is a circuit diagram showing the circuit structure of the imaging device shown in FIG. 1. FIG. 3 is a circuit diagram showing one example of sensor cells making up a pixel array. FIGS. 4A and 4B are waveform diagrams, respectively illustrating an output of the sensor cell shown in FIG. 3. FIG. 5 is a circuit diagram showing detailed structures of a single column amplifier of a column amplifier group and a control voltage supply circuit. FIG. 6 is a graph showing characteristics of an inversion amplifier included in the column amplifier.

In FIG. 1, a solid-state imaging device 1 has a pixel array 2, in which sensor cells are arranged in a matrix. For example, a CMOS sensor cell or a sensor cell with a threshold modulation system may be used as each of the sensor cells making up the pixel array 2.

In the pixel array 2, pixels (sensor cells) are formed in accordance with the intersection of a plurality of gate lines and a plurality of column lines. For example, the pixel array 2 includes 640×480 sensor cells and a region for optical black (OB region). Including the OB region, for example, the pixel array 2 is made up of 712×500 sensor cells. The pixel array 2, upon receiving different driving signals as will be described below, outputs a pixel signal in accordance with the amount of light received by each sensor cell.

A vertical scanning circuit 3 is a circuit for selecting one of a read-out line and a clear line. The vertical scanning circuit 3 supplies a selection signal for selecting either of a read-out line or of a clear line to each gate. A sensor cell corresponding to the gate line of the pixel array 2 determined as a read-out line by the vertical scanning circuit 3 outputs a pixel signal in accordance with the amount of light to each column line. Additionally, a residual electric charge in a corresponding sensor cell is drained into a line of the pixel array 2 determined as a clear line by the vertical scanning circuit 2.

Each column is connected to each column amplifier 11 of a column amplifier group 4. The column amplifier group 4, as will be described below, is made up of the column amplifiers 11, line memories 12 and the like. Upon receiving a control voltage from a control voltage supply circuit 7, the column amplifier group 4 amplifies a pixel signal transferred via each column line to output the pixel signal after removing a noise component included therein. A horizontal scanning circuit 5 controls each column amplifier 11 connected to each column line to output pixel signals of each line sent from the pixel array 2 to an output circuit 6. The output circuit 6 outputs the pixel signals of each line sequentially as image signal outputs.

FIG. 3 shows a CMOS sensor cell as an example of the sensor cells used in the pixel array shown in FIG. 1.

A sensor cell 2a shown in FIG. 3 has a floating diffusion FD as a charge accumulation region, which corresponds to a photodiode PD. A transfer gate T11 for transferring a light-generated charge from the photodiode PD to the floating diffusion FD is disposed between the photodiode PD and the floating diffusion FD.

The photodiode PD generates the light-generated charge in accordance with an incident light. The generated charge is transferred to the floating diffusion FD via the transfer gate T11 to be maintained therein.

A reset transistor T12 is connected between the floating diffusion FD and a fixed potential point. The reset transistor T12 is turned on in a reset period to discharge the electric charge left in the floating diffusion FD to the fixed potential point.

A gate of an amplifying transistor T13 is connected to the floating diffusion FD. A source of the amplifying transistor T13 is connected to a power supply terminal, and a drain thereof is connected to an output end via a source-drain path of a selection transistor T14.

A potential based on the light-generated charge accumulated in the floating diffusion FD is output to an output end via the amplifying transistor T13 and the selection transistor T14 that make up an output section.

FIGS. 4A and 4B each show an output appearing at the output end. FIG. 4A shows an output in a rolling shutter mode, and FIG. 4B shows an output in a frame shutter mode.

In the rolling shutter mode, a reset period is set first. Regarding a sensor cell 2a shown in FIG. 3, in order to read out a noise component, the reset transistor T12 is turned on to reset the floating diffusion FD. Then, a potential based on a light-generated charge remaining in the floating diffusion FD is output (readout of a noise component). In other words, in the reset period, a high-level output voltage Vo is output (see FIG. 4A).

Next, the light-generated charge generated by the photodiode PD is transferred to the floating diffusion FD via the transfer gate T11. Then, a potential based on the light-generated charge transferred to the floating diffusion ED is output (readout of a signal component). That is, the potential output in the signal-readout period is an output Vo−Vps based on a voltage that has decreased by a voltage based on the light-generated charge from the power supply voltage.

That is, as shown in FIG. 4A, in the rolling shutter mode, the level of each pixel signal drops from a high to lower value. On the contrary, in the frame shutter mode, as explained above, a signal component is read out before the readout of noise. Accordingly, as shown in FIG. 4B, the level of each pixel signal rises from a low to higher value.

The results shown in FIGS. 4A and 4B are obtained in a case of the circuit shown in FIG. 3. Depending on how to supply the power supply voltage and the like, it is possible that the level of each pixel signal in the rolling shutter mode rises from a low to higher value, whereas the signal level in the frame shutter mode drops from a high to lower value.

Each square frame shown in FIG. 2 represents a sensor cell 2a forming a pixel. An output end of the sensor cell 2a in FIG. 3 is connected to a column line as a signal line. Each sensor cell 2a of each row is connected to a gate line of each line. The vertical scanning circuit 3 supplies a selection signal to each gate line. The sensor cell 2a, which is connected to a gate line designated as a readout line by the selection signal, outputs a potential based on a charge left in the floating diffusion FD as a pixel signal (including a noise component). If the charge in the floating diffusion FD is cleared by a resetting operation before the readout, the output pixel signal will be a noise component.

Each column amplifier 11 of the column amplifier group 4 is disposed for each column line, and the structures of the column amplifiers 11 are mutually equal. The column amplifier 11 as an amplifying element is made up of capacitors C1 to C3, an inversion amplifier 11b and a switch 11c. An output voltage from a pixel is supplied to an input end of the inversion amplifier 11b via the capacitor C1 connected to the column line. The capacitor C2 is connected between the output and input ends of the inversion amplifier 11b. Additionally, the switch 11c is connected to both ends of the capacitor C2.

In the first embodiment of the invention, a first end of the capacitor C3 is connected to the input end of the inversion amplifier 11b. The control voltage supply circuit 7 supplies one of first and second control voltages to the second end of the capacitor 3 by via a control line.

FIG. 5 is a circuit diagram showing one of the column amplifiers 11 and the control voltage supply circuit 7. FIG. 5 illustrates an example made up of transistors T71 and T72, in which the control voltage supply circuit 7 is connected between a power supply terminal and a reference potential point.

A source-drain path of the P-type transistor T71 and a source-drain path of the N-type transistor T72 are connected in series between the power supply terminal and the reference potential point. Gates of the P-type transistor T71 and N-type transistor T72 are connected in common to receive a control signal φclp.

When the control signal φclp is at a high level (hereinafter referred to as "H"), a potential of the reference potential point appears at an output end of a connection point between the transistors T71 and T72. On the other hand, when the control signal φclp is at a low level (hereinafter referred to as "L"), a power supply voltage appears at the output end of the connection point thereof. An output of the control voltage supply circuit 7 is supplied to a control input end 11a of the column amplifier 11 via a control line (see FIG. 2). The capacitor C3 is connected between the control input end 11a and the input end of the inversion amplifier 11b.

The switch 11c is turned on in an "L" period of the control signal φclp, and is turned off in an "H" period thereof.

FIG. 6 is a graph showing the input and output characteristics of the inversion amplifier 11b. As shown in FIG. 6, the inversion amplifier 11b amplifies an input signal with a gain—G and outputs the amplified signal. When the value of G is large enough, a potential Va of the input end of the inversion amplifier 11b becomes close to the threshold voltage Vth. The inversion amplifier 11b may be made up of an operational amplifier.

Next, operations of the inversion amplifier 11 constructed as above will be explained below. Among two output pixel signals, namely, a post-reset pixel signal and a pixel signal based on a transferred light-generated charge, a first output signal will be referred to as a prior pixel signal, and a second output signal as a posterior pixel signal. For a brief illustration, a case of noise prior readout, in which the prior pixel signal is a post-reset pixel signal, will be explained below.

A pixel signal Vin output from a pixel via a column line is supplied to the input end of the inversion amplifier 11b via the capacitor C1 of the column amplifier 11. Here, to simplify illustration, it is assumed that the capacitor C3 is not connected to the inversion amplifier 11.

First, as a pixel signal Vin, a noise component Vo is assumed to be input from the column line. The noise component Vo is present in the capacitor C1, as well as is sent to the capacitor C2. However, when the switch 11c is turned on, the electric charge of the signal in the capacitor 2 is drained and the noise component Vo is left only in the capacitor C1.

Next, a pixel signal component Vps+Vo is output via the column line. The output signal component is sent to the capacitor C2 via the capacitor C1. In this case, a potential of the input end of the inversion amplifier 11b is stabilized. As a result, a potential based on a difference between the voltage Vo left in the capacitor C1 after the reset and the pixel signal component Vps+Vo is sent to the capacitor C2.

The potential sent to the capacitor C2 corresponds to a capacitance ratio between the capacitors C1 and C2. Consequently, an output with a level of Vps×C1/C2 is output to an output end 11d. That is, the use of the column amplifier 11 enables obtaining of an output in which the noise component Vo has been removed.

Furthermore, in this embodiment, the capacitor C3 is connected to the input end of the inversion amplifier 11b. Accordingly, in the "L" period of the control signal φclp, namely, in the period in which the switch 11c is ON, a power supply voltage Vdd as a control voltage is applied to the control input end 11a. Then, a voltage based on a capacitance ratio between the capacitors C3/C2 and the power supply voltage Vdd is added to the output. As will be described below, the voltage component has a polarity opposite to that of the output based on the capacitance ratio between C1/C2 mentioned above, and thus is a voltage added in a direction opposite to the change of an output based on a threshold voltage.

Therefore, even when the pixel signal Vin input to the column amplifier 11 drops from a high to lower level, or conversely, rises from a low to higher level, the output is shifted in a direction opposite to the peak direction of amplitude. This can prevent the output from deviating from a dynamic range.

In FIG. 2, the output end 11d (see FIG. 5) of the column amplifier 11 is branched into two lines to be connected to the line memory 12 via switches 12a and 12b. Each line memory 12 has two capacitors C12a and 12b for each column line, where a voltage input to the column amplifier 11 via the switches 12a and 12b is output to the capacitors C12a and C12b to be maintained therein.

The switches 12a and 12b, for example, are turned ON when the output of each column amplifier 11 is a prior pixel signal or a posterior pixel signal. As a result, the output of the column amplifier 11 based on the prior pixel signal is maintained in the capacitor C12a, whereas the output of the column amplifier 11 based on the posterior pixel signal to be maintained in the capacitor C12b.

Each capacitor C12a corresponding to each column line is connected to a positive signal line 12e via an amplifier A12a and a capacitor C12c. Each capacitor C12b corresponding to each column line is connected to a negative signal line 12f via an amplifier A12b and a capacitor C12d. The signal lines 12e and 12f are connected respectively to a positive or negative input end of a differential amplifier 6a. The differential amplifier 6a outputs an output based on a difference between two input signal components as an image signal output.

Figure 7:
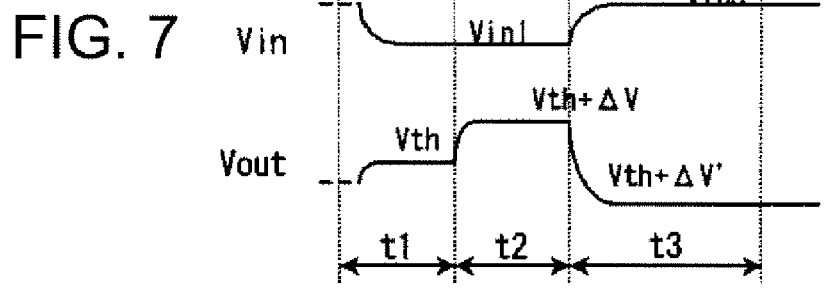
FIG. 7 is a waveform diagram showing operations according to the first embodiment of the invention.
Figure 8:
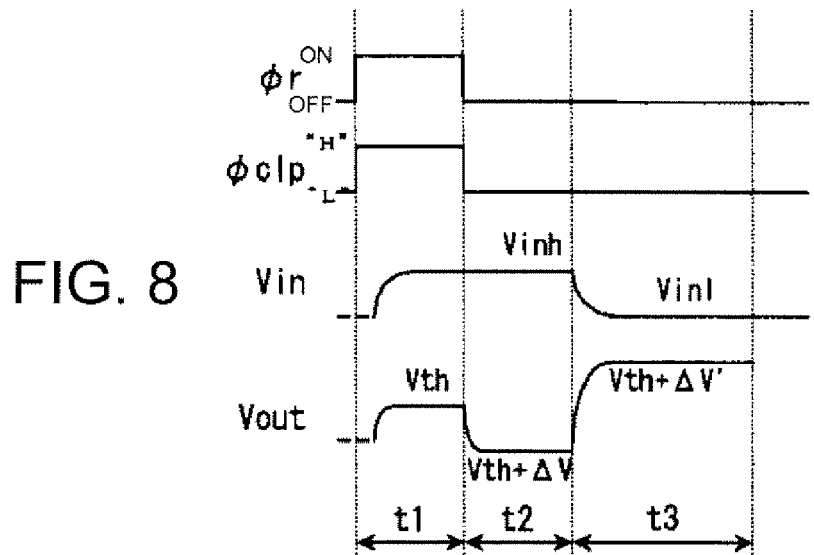
FIG. 8 is another waveform diagram showing operations according to the first embodiment of the invention.

Next, operations of a second embodiment constructed as above will be explained referring to FIGS. 7 and 8. FIG. 7 shows an example in which the level of a prior pixel signal is lower and that of a posterior pixel signal is higher. FIG. 8 shows an example with a high-level prior pixel signal and a low-level posterior pixel signal. However, as explained above, in both examples shown in FIGS. 7 and 8, when the prior pixel signal is a post-reset pixel signal, the posterior pixel signal is a pixel signal based on a transferred light-generated charge (a noise-including signal), whereas when the prior pixel signal is a pixel signal based on a transferred light-generated charge (a noise-including signal), the posterior pixel signal is a post-reset pixel signal.

FIG. 7 and FIG. 8 each show an ON and OFF status of the switch 11c, the control signal φclp, the pixel signal Vin and the output Vout of the column amplifier 11.

Here, as shown in FIG. 7, the level of a prior pixel signal is assumed to be low and that of a posterior pixel signal is assumed to be high.

A t1 period shown in FIG. 7 is a period in which the column amplifier 11 is reset, when the switch 11c is ON. Additionally, the control signal φclp is at an "L" level, and the terminal 11a receives the power supply voltage Vdd.

Consequently, in the t1 period, electric charges Q1 to Q3 present in the capacitors C1 to C3 can be obtained as below. In the following expressions, symbols C1 to C3 indicate capacitance values of the capacitors C1 to C3; symbol Va indicates a voltage of the input end of the inversion amplifier 11b; symbol Vinl indicates the level of a prior pixel signal; symbol Vth indicates a threshold voltage of the inversion amplifier 11b; and symbol Vdd indicates a power supply voltage.

t1 period:

$$Q1 = C1 \times (Va - Vinl) = C1 \times (Vth - Vinl);$$

$$Q2 = 0; \text{ and,}$$

$$Q3 = C3 \times (Va - Vdd) = C3 \times (Vth - Vdd)$$

A t2 period shows a situation in which a reset of the column amplifier has been completed and the prior pixel signal has been input to the capacitor C1. In this period, electric charges Q1' to Q3' present in the capacitors C1 to C3 are obtained as below. The voltage of the input end of the inversion amplifier 11b is indicated by symbol Va'. The voltage Va' represents a value in which Va (=Vth) has changed by 1/gain (1/G) of a difference (ΔV) between outputs of the inversion amplifier 11b.

t2 period:

$$Q1' = C1 \times (Va' - Vinl) = C1 \times \{(Vth - \Delta V/G) - Vinl\};$$

$$Q2' = C2 \times (Va' - Vo) = C2 \times \{(Vth - \Delta V/G) - (Vth + \Delta V)\}; \text{ and}$$

$$Q3' = C3 \times (Va' - 0) = C3 \times (Vth - \Delta V/G)$$

In this case, there holds an equation: Q1+Q2+Q3=Q1'+Q2'+Q3'. Therefore, a formula can be obtained as follows: ΔV=C3×Vdd/{C1/G+(1+1/G)×C2+C3/G}.

When the gain G is very large (G>>1), the situation can be expressed by an equation as follows: ΔV=C3/C2×Vdd. Therefore, an output Vout1 of the column amplifier 11 in the t2 period can be obtained by the following equation (1).

$$Vout1 = Vth + C3/C2 \times Vdd \quad (1)$$

A t3 period is a period in which a posterior pixel signal is input. In this period, electric charges Q1" to Q3" present in the capacitors C1 to C3 are obtained as below. In this situation, a voltage Va" of the input end of the inversion amplifier 11b represents a value in which Vth has changed by 1/gain (1/G) of a difference (ΔV') between the outputs of the inversion amplifier 11b.

t3 period:

$$Q1'' = C1 \times (Va'' - Vinh) = C1 \times \{(Vth - \Delta V'/G) - Vinh\};$$

$$Q2'' = C2 \times (Va'' - Vout2) = C2 \times \{(Vth - \Delta V'/G) - (Vth + \Delta V')\}; \text{ and}$$

$$Q3'' = C3 \times (Va'' - 0) = C3 \times (Vth - \Delta V'/G)$$

In this case, there holds an equation as follows: Q1+Q2+Q3=Q1"+Q2"+Q3". Thus, when the gain G is very large (G>>1), a formula can be obtained as follows: ΔV'=C3/C2×Vdd−C1/C2×(Vinh−Vinl). Therefore, an output Vout2 of the column amplifier 11 in the t3 period can be expressed by the following equation (2).

$$Vout2 = Vth + C3/C2 \times Vdd - C1/C2 \times (Vinh - Vinl) \quad (2)$$

The third term in the equation (2) represents a difference between the prior pixel signal and the posterior pixel signal. This corresponds to a signal in which a noise component is removed from a pixel signal based on a transferred light-generated charge.

The third term on the right-hand side therein represents a signal in accordance with the amount of light. The value thereof shifts in a negative voltage direction, whereas a voltage level of the output Vout2 shifts in a positive direction due to a component of the second term therein. Accordingly, this prevents the output of Vout2 from deviating from a dynamic range of the inversion amplifier 11b.

In order to remove dispersion among the Vth of the column amplifier 11, the capacitance values and the like, an output of the column amplifier 11 is supplied to the differential amplifier 6a to obtain a difference between Vout1 and Vout2. In other words, the output Vout1 of the column amplifier 11 in the t2 period is maintained in the capacitor 12a as a first capacitor of the line memory 12, and the output Vout2 of the column amplifier 11 in the t3 period is maintained in the capacitor 12b as a second capacitor thereof, for example. Then, the outputs Vout1 and Vout2 maintained in the capacitors 12a and 12b of the line memory 12 are supplied to the differential amplifier 6a. The differential amplifier 6a calculates the values of Vout1−Vout2 to output an image signal. That is, the differential amplifier 6a calculates the output C1/C2×(Vinh−Vinl) in each column.

Next, as shown in FIG. 8, the level of the prior pixel signal is assumed to be high and the level of the posterior pixel signal is assumed to be low.

Similar to the example shown in FIG. 7, in order to obtain the outputs Vout1 and Vout2 of the column amplifier 11 in the t2 and t3 periods in FIG. 8, the following equations (3) and (4) can be used.

$$Vout1 = Vth - C3/C2 \times Vdd \quad (3)$$

$$Vout2 = Vth - C3/C2 \times Vdd + C1/C2 \times (Vinh - Vinl) \quad (4)$$

The third term in the above equation (4), similar to the equation (2), represents a difference between a prior pixel signal and a posterior pixel signal, and corresponds to a signal in which a noise component has been removed from a pixel signal based on a transferred light-generated charge. A value of the third term on the right-hand side therein shifts in a positive voltage direction, whereas an output voltage Vout2 shifts in a negative direction due to a component of the second term therein. This prevents the value of Vout2 from deviating from the dynamic range of the inversion amplifier 11b.

In the case of the ordinary CMOS sensor shown in FIG. 3, a signal voltage in the pixel reset period is high, whereas a signal voltage in accordance with the amount of light is low. When a pixel reset voltage is expressed by Vinh=Vo and the signal voltage in accordance with the amount of light is expressed by Vinl=Vo−Vps (the greater the amount of light, the larger the value of Vps), if they are substituted in the above equations of Vout1 and Vout2, the difference between Vout1 and Vout2 can be obtained by C1/C2×Vps. In other words, it can be seen that the column amplifier 11 outputs a voltage in which the signal component in accordance with the amount of light has been amplified as much as C1/C2 times. Additionally, as is clear by a comparison between the cases of the above equations (2) and (4), a desired signal can be obtained regardless of which is input first, Vinh or Vinl.

If values of the second and third terms in the equations (2) and (4) are matched with each other, it will enable the most effective use of the dynamic range.

In FIG. 5, as the control voltage supply circuit 7, the example using an inverter circuit has been explained. However, as long as the circuit can supply first and second voltages, it is obvious that any circuit structure can be applied. In addition, as long as the first and second voltages can be supplied to the control input end 11a of the column amplifier 11, it is enough for the solid-state imaging device to have a single circuit as the control voltage supply circuit 7.

In the embodiment described above, the capacitors are connected to the input ends of the inversion amplifier, and a voltage applied to the capacitors is switched to the first or second voltage. This changes the output of the amplifier to prevent the output from deviating from the dynamic range thereof. Accordingly, even when a prior pixel signal is at a high level and a posterior pixel signal is at a low level, or conversely the former level is low and the latter level is high, that is, in both of the rolling and frame shutter modes, the embodiment can prevent the output of the column amplifier from deviating from the dynamic range thereof.

The embodiment can be applied regardless of which of a post-reset pixel signal and a pixel signal based on a transferred light-generated charge is at a high level. Moreover, the embodiment can be applied regardless of which of a prior pixel signal and a posterior pixel signal is at a high level. Accordingly, the embodiment can be similarly applied regardless of a prior or posterior readout of noise.

Unlike the above example of related art, no bias circuit is required. Thus, an area for the circuit can be omitted.

Figure 9:
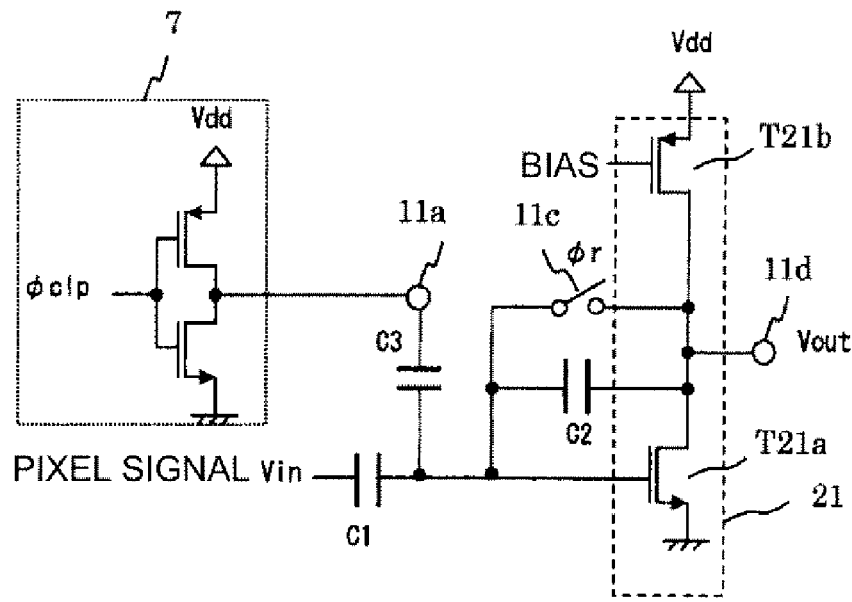
FIG. 9 is a circuit diagram showing a column amplifier employed in a second embodiment of the invention.

FIG. 9 is a circuit diagram showing a column amplifier used in a second embodiment of the invention. In FIG. 9, the same elements as those in FIG. 5 are provided with the same reference symbols, and will not be illustrated here again.

The second embodiment uses an inversion amplifier 21 instead of the inversion amplifier 11b, and employs a controlling method using a control signal φclp, but which is different from that of the first embodiment.

The inversion amplifier 21 is made up of an N-type MOS transistor T21a and a P-type MOS transistor T21b. A gate of the transistor T21a is an input end of the inversion amplifier 21 and is connected to connection points between the capacitors C1 to C3. A drain of the transistor T21a is connected to the output terminal 11d, and a source thereof is connected to the reference potential point. A source of the transistor T21b is connected to the power supply terminal and a drain thereof is connected to the source of the transistor T21a. Additionally, a bias voltage is applied to a gate of the transistor T21b, so that the transistor T21b functions as a constant current source.

In the above structure, the inversion amplifier 21 performs inversion amplification using the transistor T21a as a source-grounded circuit. In this case, a threshold voltage Vth of the inversion amplifier 21 is low and equal to or less than 1V (for example, 0.8V). Accordingly, an output of the column amplifier using the inversion amplifier 21 shifts to a relatively negative side.

Thus, in the circuit shown in FIG. 9, when a prior pixel signal is input at a low level and a posterior pixel signal is input at a high level, that is, when equivalent to the case shown in FIG. 8, the output Vout1 of the column amplifier in the t2 period becomes excessively low and thus is likely to deviate from a dynamic range of the inversion amplifier 21.

Accordingly, in the embodiment, when a prior pixel signal is input at a high level and a posterior pixel signal is input at a low level, a control by the control signal φclp is performed as in the case of FIG. 7. On the contrary, when a low-level prior pixel signal is input and a high-level posterior pixel signal is input, the control signal φclp is stabilized at the level of "H", so that any control is not performed for shifting the dynamic range of the inversion amplifier 21.

Now, operations of the embodiment will be described below referring to FIGS. 10A and 10B. Both figures show operational waveforms corresponding to those shown in FIGS. 7 and 8.

Figure 10A:
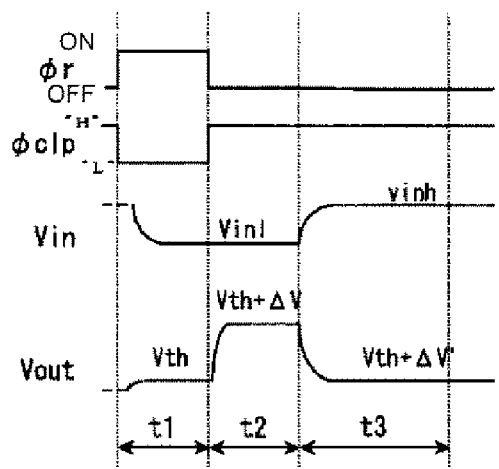
FIG. 10 is a view showing operations of the second embodiment of the invention.

In FIG. 10A, a pixel input is represented by symbol Vin, and a prior pixel signal is input at a high level whereas a posterior pixel signal is input at a low level. In this case, the same control as shown in FIG. 7 is performed. In other words, in this situation, outputs Vout1 and Vout2 in the t2 and t3 periods can be obtained by the above equations (1) and (2).

Figure 10B:
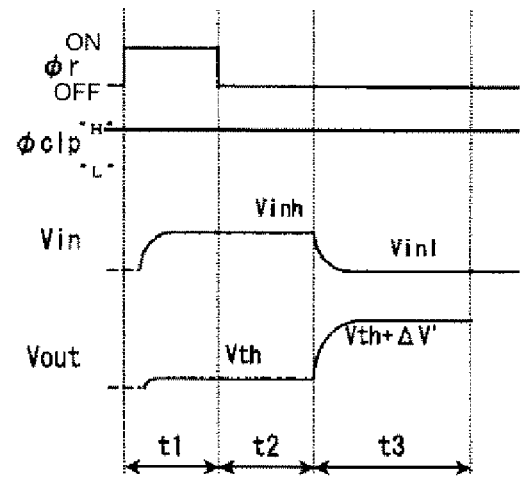

In FIG. 10B, the pixel input is similarly represented by Vin, but the prior pixel signal is at a low level whereas the posterior pixel signal is at a high level. According to the embodiment, in this case, the control signal φclp is stabilized at the level of "H" as shown in FIG. 10B.

Thus, outputs Vout1 and Vout2 in the t2 and t3 periods can be obtained by the following equations (5) and (6), in which the second terms in the equations (3) and (4) have been eliminated.

$$Vout1 = Vth \quad (5);$$

$$Vout2 = Vth + C1/C2 \times (Vinh - Vinl) \quad (6)$$

In this case also, a difference between the outputs Vout1 and Vout2 is obtained by the expression C1/C2×(Vinh−Vinl). Accordingly, it can be seen that an output without a noise component can be obtained.

As described above, in the embodiment, the source-grounded N-type transistor is used as an inversion amplifier. Thus, a low threshold voltage Vth can be obtained. Furthermore, when a low-level prior pixel signal and a high-level posterior pixel signal are input, the shifting control of the dynamic range of the amplifier can be omitted.

For example, as shown in FIG. 3, when the level of a noise output is high and the level of a signal is low, if a prior pixel signal is at a high level and a posterior pixel signal is at a low level, that is, in the case of the frame shutter mode as shown in FIG. 3, the level of the control signal φclp is controlled. On the contrary, as also shown in FIG. 3, when the level of a noise output is high and the level of a signal is low, if a prior pixel signal is at a low level and a posterior pixel signal is at a high level, that is, in the case of the rolling shutter mode as shown in FIG. 3, switching operation by the control signal φclp is not performed, so that the level of the signal φclp can be stabilized at the level of "H".

Figure 11:
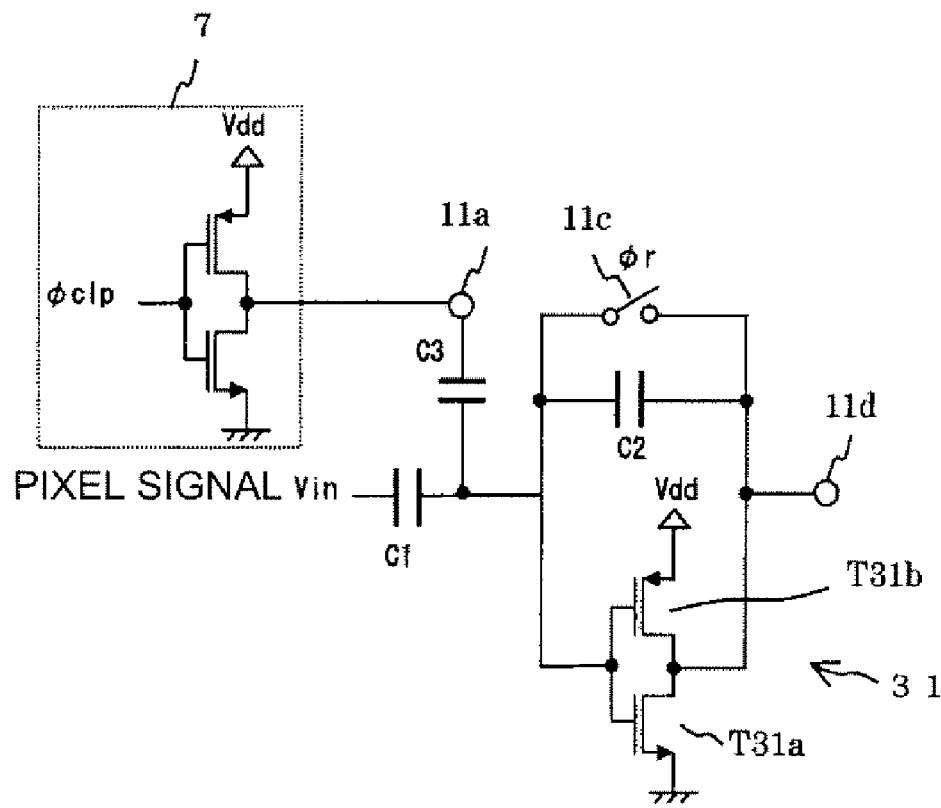
FIG. 11 is a circuit diagram showing a modification of the second embodiment of the invention.

FIG. 11 is a circuit diagram showing a modification of the second embodiment shown in FIG. 9. In FIG. 11, the same reference symbols as those in FIG. 9 are given to the corresponding elements, and illustrations of them will be omitted in the description below.

FIG. 11 shows an example using an inversion amplifier 31 instead of the inversion amplifier 21. The inversion amplifier 31 is made up of an N-type MOS transistor T31a and a P-type MOS transistor T31b. Gates of these transistors are connected in common to be used as an input end of the inversion amplifier 31. A drain of the transistor T31a is connected to the output terminal 11d and a source thereof is connected to the reference potential point. A source of the transistor T31b is connected to the power supply terminal and a drain thereof is connected to the source of the transistor 31a.

In this structure, a threshold voltage Vth of the inversion amplifier 31 is expressed by Vdd/2, which is a relatively high voltage level. Accordingly, an output of the column amplifier using the inversion amplifier 31 moves to the more positive side.

Consequently, in the circuit shown in FIG. 11, when a prior pixel signal is at a high level and a posterior pixel signal is at a low level, that is, when equivalent to the case shown in FIG. 7, an output Vout1 of the column amplifier in the t2 period becomes excessively high, and thus is likely to deviate from a dynamic range of the inversion amplifier 31.

Therefore, the example shown in FIG. 11 shows the control opposite to that shown in FIG. 9. Specifically, when a prior pixel signal is input at a high level and a posterior pixel signal is input at a low level, the control signal φclp is stabilized at the level of "H" and shifting control of the dynamic range is not performed. Conversely, when a prior pixel signal is input at a low level and a posterior pixel signal is input at a high level, the level of the control signal φclp is changed to perform the shifting control.

This prevents an increase in a voltage as given by the second term in each of the above equations (1) and (2). Therefore, operations of the inversion amplifier can be performed within the dynamic range thereof.

Other operational effects and results are the same as those in the second embodiment shown in FIG. 9.

Figure 12:
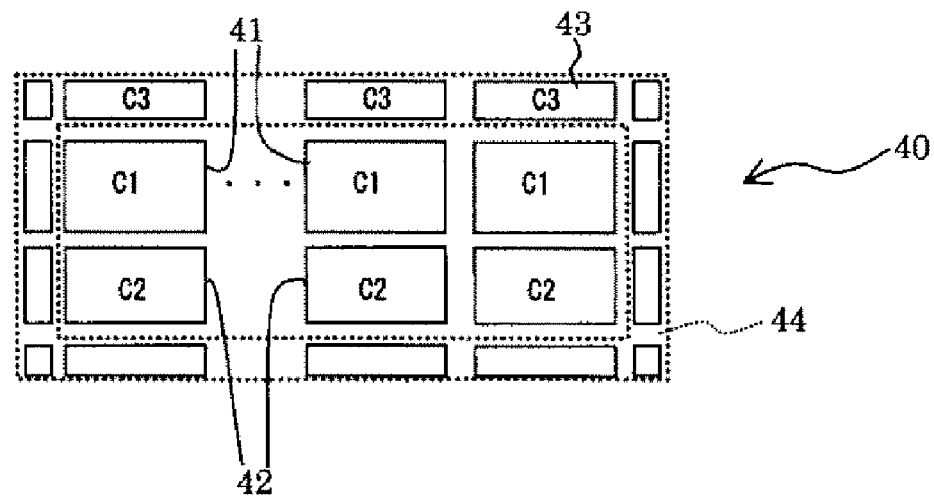
FIG. 12 is an explanatory view showing a chip layout employed in a third embodiment of the invention.

FIG. 12 is an explanatory view showing a chip layout used in a third embodiment of the invention. FIG. 12 shows a layout of three capacitors making up a column amplifier.

A capacitance formation region 40 shown in FIG. 12 corresponds to the formation region of the column amplifier group 4 shown in FIG. 1. A periphery of the capacitance formation region 40 is a dummy capacitance formation region 44 forming a dummy capacitance. In general, in order to reduce dispersion between capacitance values, when arranging a capacitance in a given region, a dummy capacitance is also arranged at the periphery of the region. The dummy capacitance functions to reduce such dispersion.

In this embodiment, the capacitors C1 and C2 of the column amplifier are formed in the center of the capacitance formation region 40. Specifically, capacitance formation regions 41 and 42 are formed for each column, each of which occupies an area for a plurality of lines. Each of capacitances formed in the regions 41 and 42 is designated as the capacitor C1 or C2.

Each capacitance has a high level of precision in the regions 41 and 42 in the center of the capacitance formation region 40. Accordingly, the capacitors C1 and C2 in each column can have a high level of precision.

On the other hand, a dummy capacitance precision is relatively low in the dummy capacitance formation region 44 at the periphery of the region 40. However, as described above, the second terms in the equations (1) to (4) including the capacitance value C3 is eliminated by obtaining the difference between the pixel signals Vout1 and Vout2. Thus, the capacitance precision of the capacitor C3 needs not to be very high. For this reason, the third embodiment uses the dummy capacitance of the dummy capacitance formation region 44 as the capacitor C3, although such a capacitance is basically not used. In other words, a dummy capacitance 43 of each column is used as the capacitor C3 of the column amplifier in each column.

As described above, in this embodiment, the dummy capacitance is used as the new capacitor C3, although the use is uncommon. Consequently, the embodiment can prevent an increase in a chip area.

In each of the embodiments above, the capacitor C3 and the control voltage supply circuit 7 are the elements added to known art. As the control voltage supply circuit 7, a single circuit is enough for an entire device. This can prevent an increase in the circuit area. In addition, the third embodiment hardly increases the area of the capacitor C3. Moreover, unlike the example of related art, the embodiments of the invention do not require a bias circuit. This enables the shifting control of a dynamic range with little increase in a chip area.

The present invention is not limited to the above embodiments, and various modifications and changes can be made without departing from the broader spirit and scope of the invention as set forth in the appended claims.

What is claimed is:

1. A solid-state imaging device, comprising:
a substrate;
a sensor cell array disposed on the substrate, the sensor cell array having a plurality of sensor cells arranged in a matrix;
a plurality of signal lines that transfer an image signal output from each of the sensor cells;
a plurality of amplifiers connected to each of the signal lines, respectively, each of the amplifiers including a first capacitance having a first end connected to a respective one of the signal lines, an inversion amplifier having an input end connected to a second end of the first capacitance, a second capacitance connected between the input end and an output end of the inversion amplifier, a switch connected between the input and output ends of the inversion amplifier to reset the second capacitance and a third capacitance having a first end connected to a control line and a second end connected to the input end of the inversion amplifier; and
a control voltage supply circuit that alternately supplies each of first and second voltages to the control line.

2. The solid-state imaging device according to claim 1, wherein each of the amplifiers is disposed for each of the signal lines, whereas the control voltage supply circuit comprises a single unit for supplying a control voltage to all of the amplifiers.

3. The solid-state imaging device according to claim 1, wherein each of the sensor cells outputs first and second pixel signals of different levels.

4. The solid-state imaging device according to claim 3, wherein each of the sensor cells has a charge accumulation region for transferring a light-generated charge based on an incident light to output a pixel signal based on the light-generated charge accumulated in the region, and outputs a pixel signal after a reset of the light-generated charge in the region and a pixel signal based on the light-generated charge accumulated in the region.

5. The solid-state imaging device according to claim 3, wherein the sensor cells comprise one of CMOS sensors and substrate modulation sensors.

6. The solid-state imaging device according to claim 1, wherein the control voltage supply circuit supplies 0V as the first voltage and a power supply voltage as the second voltage.

7. The solid-state imaging device according to claim 6, wherein the control voltage supply circuit is comprised of an inverter.

8. The solid-state imaging device according to claim 1, wherein the control voltage supply circuit switches one of the first and second voltages in response to a reset of the second capacitance.

9. The solid-state imaging device according to claim 1, wherein the inversion amplifier is comprised of an operational amplifier.

10. The solid-state imaging device according to claim 1, wherein the inversion amplifier is comprised of a source-grounded transistor.

11. The solid-state imaging device according to claim 1, wherein each of the sensor cells outputs first and second pixel signals of different levels, and the control voltage supply circuit supplies only one of the first and second voltages when the second pixel signal is input at a high level after the first signal has been input at a low level.

12. The solid-state imaging device according to claim 1, wherein the inversion amplifier is comprised of an inverter.

13. The solid-state imaging device according to claim 1, wherein each of the sensor cells outputs first and second pixel signals of different levels, and the control voltage supply circuit supplies only one of the first and second voltages when the first pixel signal is input at a low level after the second pixel signal has been input at a high level.

14. The solid-state imaging device according to claim 1, wherein the third capacitance is comprised of a capacitance of a periphery of a capacitance formation region including a formation region of the sensor cell array.

* * * * *